US012550759B2

(12) United States Patent
Lee et al.

(10) Patent No.: US 12,550,759 B2
(45) Date of Patent: Feb. 10, 2026

(54) SEMICONDUCTOR PACKAGE

(71) Applicant: SAMSUNG ELECTRONICS CO., LTD., Suwon-si (KR)

(72) Inventors: Changbo Lee, Hwaseong-si (KR); Joonseok Oh, Seoul (KR); Youngmin Kim, Cheonan-si (KR); Jihye Shin, Cheonan-si (KR); Hyundong Lee, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 591 days.

(21) Appl. No.: 18/053,806

(22) Filed: Nov. 9, 2022

(65) Prior Publication Data

US 2023/0142301 A1    May 11, 2023

(30) Foreign Application Priority Data

Nov. 11, 2021 (KR) .................. 10-2021-0155158
Jan. 20, 2022 (KR) .................. 10-2022-0008689

(51) Int. Cl.
| | | |
|---|---|---|
| *H01L 23/498* | (2006.01) | |
| *H10W 70/65* | (2026.01) | |
| *H10W 70/69* | (2026.01) | |
| *H10W 90/00* | (2026.01) | |
| *H10W 70/60* | (2026.01) | |
| *H10W 74/00* | (2026.01) | |
| *H10W 74/10* | (2026.01) | |

(52) U.S. Cl.
CPC ........... *H10W 70/65* (2026.01); *H10W 70/69* (2026.01); *H10W 90/00* (2026.01); *H10W 70/60* (2026.01); *H10W 74/00* (2026.01); *H10W 74/127* (2026.01); *H10W 90/701* (2026.01); *H10W 90/722* (2026.01); *H10W 90/724* (2026.01)

(58) Field of Classification Search
None
See application file for complete search history.

(56) References Cited

U.S. PATENT DOCUMENTS

| 5,959,363 A | 9/1999 | Yamada et al. |
|---|---|---|
| 10,026,668 B1 | 7/2018 | Lee et al. |

(Continued)

FOREIGN PATENT DOCUMENTS

| CN | 104952745 B | 12/2017 |
|---|---|---|
| CN | 107564884 A | 1/2018 |

(Continued)

*Primary Examiner* — Hung K Vu
(74) *Attorney, Agent, or Firm* — Wolf, Greenfield & Sacks, P.C.

(57) ABSTRACT

A semiconductor package includes a first redistribution structure including a plurality of first redistribution layers and a plurality of first redistribution vias. A semiconductor chip is on the first redistribution structure. The semiconductor chip includes a chip pad. A connection pad is between the first redistribution structure and the semiconductor chip, and is connected to the first redistribution structure. A connection bump is connected to the connection pad and the chip pad. A molding layer extends around the first redistribution structure and the semiconductor chip, and a through electrode extends through the molding layer. A wetting layer is between the first redistribution structure and the molding layer.

20 Claims, 13 Drawing Sheets

(56) References Cited

U.S. PATENT DOCUMENTS

| | | | |
|---|---|---|---|
| 10,096,558 B1 | 10/2018 | Chiang et al. | |
| 11,101,140 B2 | 8/2021 | Wei et al. | |
| 2013/0075924 A1* | 3/2013 | Lin | H01L 23/3128 438/109 |
| 2017/0025342 A1* | 1/2017 | Tseng | C25D 7/12 |
| 2019/0006305 A1 | 1/2019 | Huang | |
| 2020/0066545 A1 | 2/2020 | Kim et al. | |
| 2020/0105676 A1* | 4/2020 | Jin | H01L 21/568 |
| 2021/0257304 A1 | 8/2021 | Shih | |

FOREIGN PATENT DOCUMENTS

| | | |
|---|---|---|
| CN | 111312697 A | 6/2020 |
| KR | 10-2014-0057979 A | 5/2014 |
| KR | 10-2021-0099244 A | 8/2021 |

\* cited by examiner

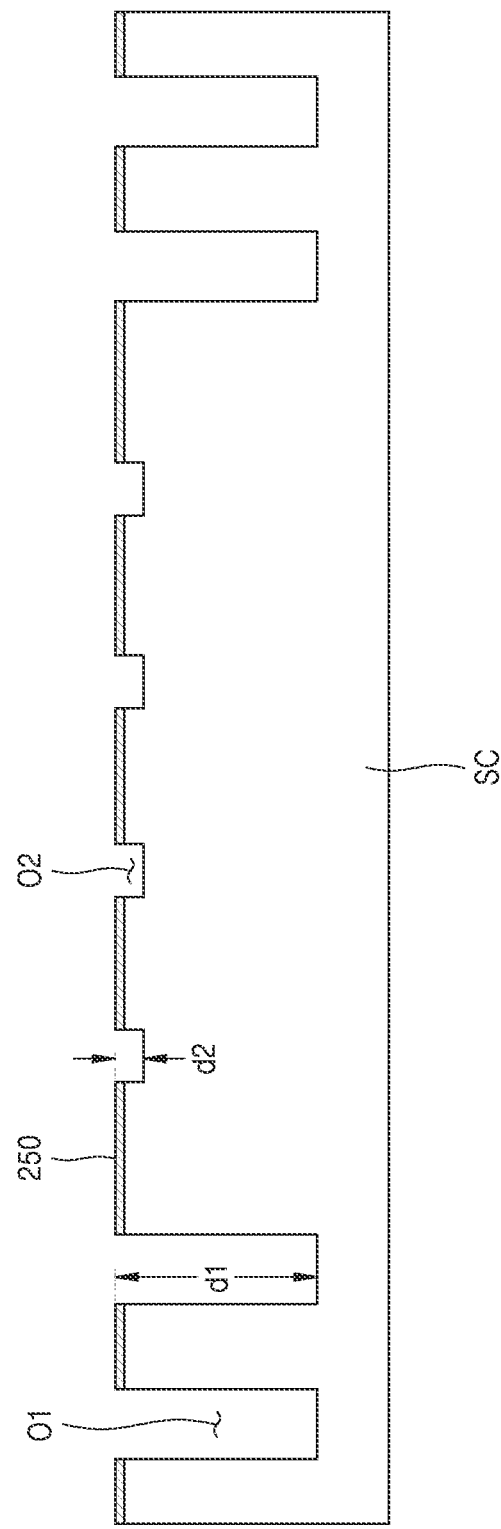

SEMICONDUCTOR PACKAGE

CROSS-REFERENCE TO RELATED APPLICATIONS

This application is based on and claims priority under 35 U.S.C. § 119 to Korean Patent Application Nos. 10-2021-0155158, filed on Nov. 11, 2021 and 10-2022-0008689, filed on Jan. 20, 2022 in the Korean Intellectual Property Office, the disclosures of which are incorporated by reference herein in their entireties.

BACKGROUND

The inventive concept relates generally to semiconductor packages and, more particularly, to fan-out semiconductor packages.

There is increased demand for semiconductor devices with enhanced functionality. In order to meet performance and price requirements of consumers, the degree of integration and miniaturization of semiconductor elements has increased. Accordingly, the sizes of semiconductor packages mounted on electronic components have been decreasing. Logic chips, memory chips, and the like included in semiconductor packages typically process large amounts of data. Accordingly, the number of input/output (I/O) terminals of semiconductor chips have increased. Unfortunately, due to a reduction in intervals between the I/O terminals, interference between the I/O terminals may occur. To mitigate the interference between the I/O terminals, fan-out semiconductor packages capable of increasing the intervals between the I/O terminals may be used.

SUMMARY

The inventive concept provides a semiconductor package with improved reliability.

According to an aspect of the inventive concept, there is provided a semiconductor package including: a first redistribution structure including a plurality of first redistribution layers and a plurality of first redistribution vias; a semiconductor chip on the first redistribution structure, the semiconductor chip including a chip pad; a connection pad between the first redistribution structure and the semiconductor chip, the connection pad connected to the first redistribution structure; a connection bump connected to the connection pad and the chip pad; a molding layer extending around the first redistribution structure and the semiconductor chip; a through electrode extending through the molding layer; and a wetting layer between the first redistribution structure and the molding layer.

According to another aspect of the inventive concept, there is provided a semiconductor package including: a first redistribution structure including a plurality of first redistribution layers and a plurality of first redistribution vias; a semiconductor chip on the first redistribution structure, the semiconductor chip including a chip pad; a connection pad between the first redistribution structure and the semiconductor chip, the connection pad connected to the first redistribution structure; a connection bump connected to the connection pad and the chip pad; a molding layer extending around the first redistribution structure and the semiconductor chip; a through electrode extending through the molding layer; a wetting layer between the first redistribution structure and the molding layer; and a second redistribution structure on the molding layer, the second redistribution structure including second redistribution layers and second redistribution vias, wherein a width of the first redistribution via increases from an upper surface of the first redistribution via toward a lower surface of the first redistribution via, and wherein a width of the second redistribution via decreases from an upper surface of the second redistribution via toward a lower surface of the first redistribution via.

According to another aspect of the inventive concept, there is provided a semiconductor package including: a first redistribution structure including a plurality of first redistribution layers and a plurality of first redistribution vias; a semiconductor chip on the first redistribution structure, the semiconductor chip including a chip pad; a connection pad between the first redistribution structure and the semiconductor chip, the connection pad connected to the first redistribution structure; a metal layer on an upper surface and side surfaces of the connection pad; a connection bump connected to the metal layer and the semiconductor chip; a molding layer extending around the first redistribution structure and the semiconductor chip; a second redistribution structure on the molding layer, the second redistribution structure including second redistribution layers and second redistribution vias, a wetting layer between the first redistribution structure and the molding layer; and a through electrode extending through the molding layer, wherein the through electrode is connected to the first redistribution via and to the second redistribution via, and wherein the through electrode has a uniform width, wherein a width of the first redistribution via increases from an upper surface of the first redistribution via toward a lower surface of the first redistribution via, and wherein a width of the second redistribution via decreases from an upper surface of the second redistribution via toward a lower surface of the first redistribution via.

BRIEF DESCRIPTION OF THE DRAWINGS

Embodiments of the inventive concept will be more clearly understood from the following detailed description taken in conjunction with the accompanying drawings in which:

FIGS. 4A through 4H are cross-sectional views illustrating each operation of a manufacturing process of a semiconductor package, according to example embodiments.

DETAILED DESCRIPTION OF THE EMBODIMENTS

Figure 1:
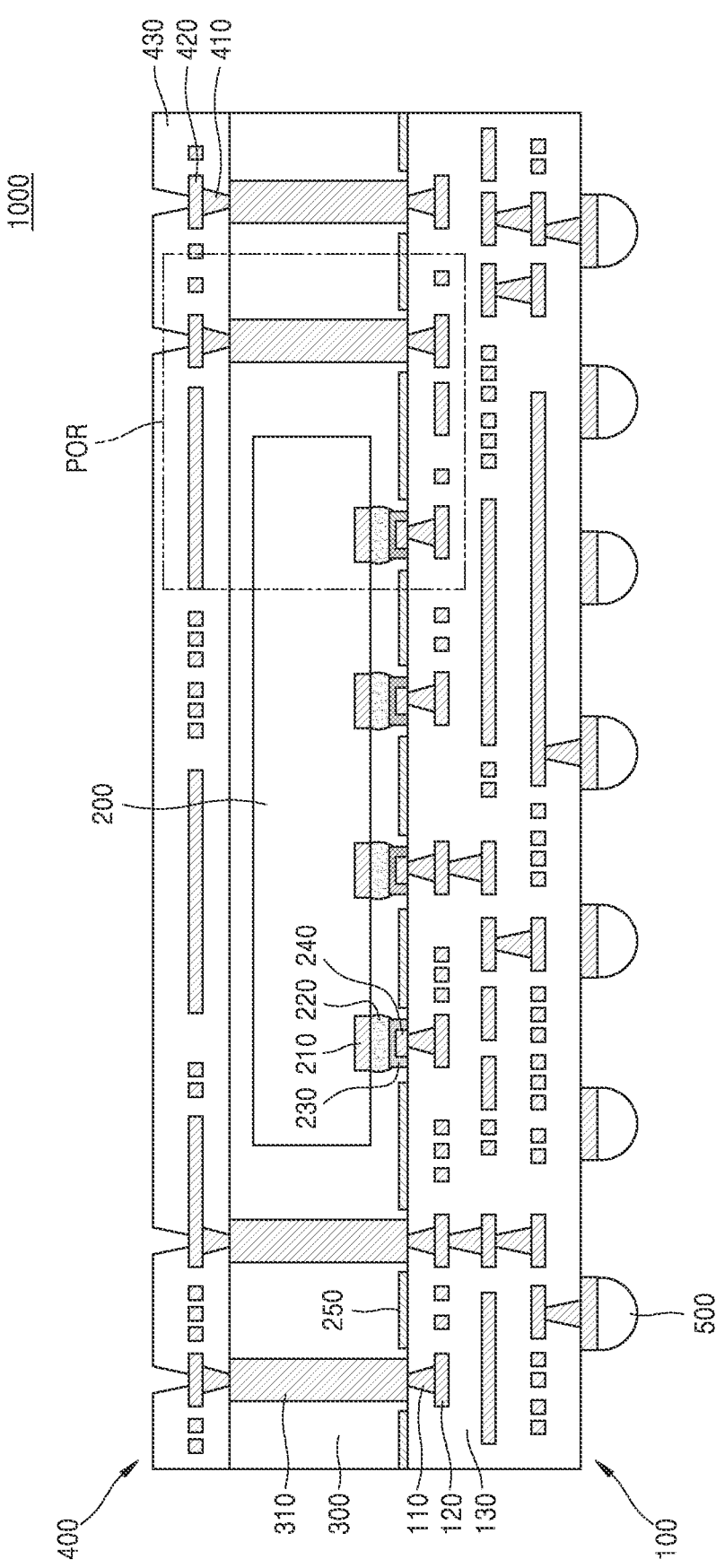
FIG. 1 is a cross-sectional view of a semiconductor package according to an example embodiment.

Hereinafter, embodiments of the inventive concept are described in detail with reference to the accompanying drawings. Identical reference numerals are used for the same constituent elements in the drawings, and duplicate descriptions thereof are omitted.

Figure 2A:
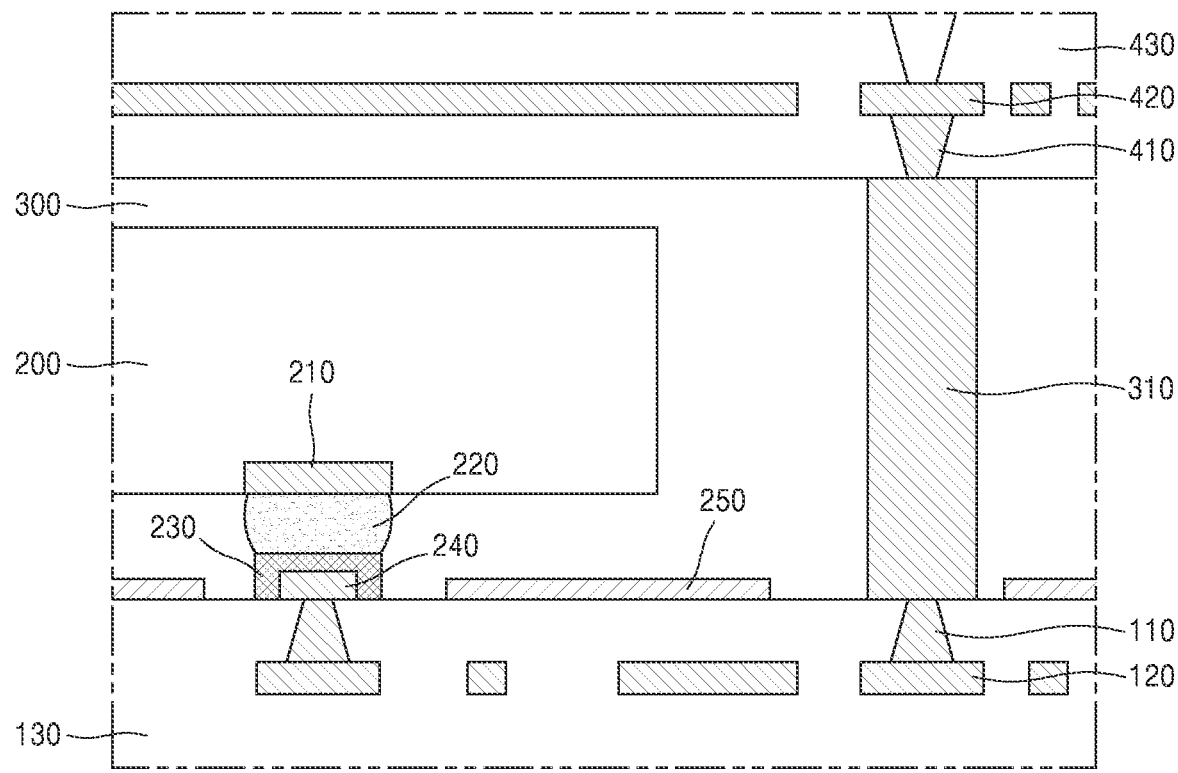
FIGS. 2A and 2B are enlarged cross-sectional views of a portion corresponding to portion POR in FIG. 1.
Figure 2B:
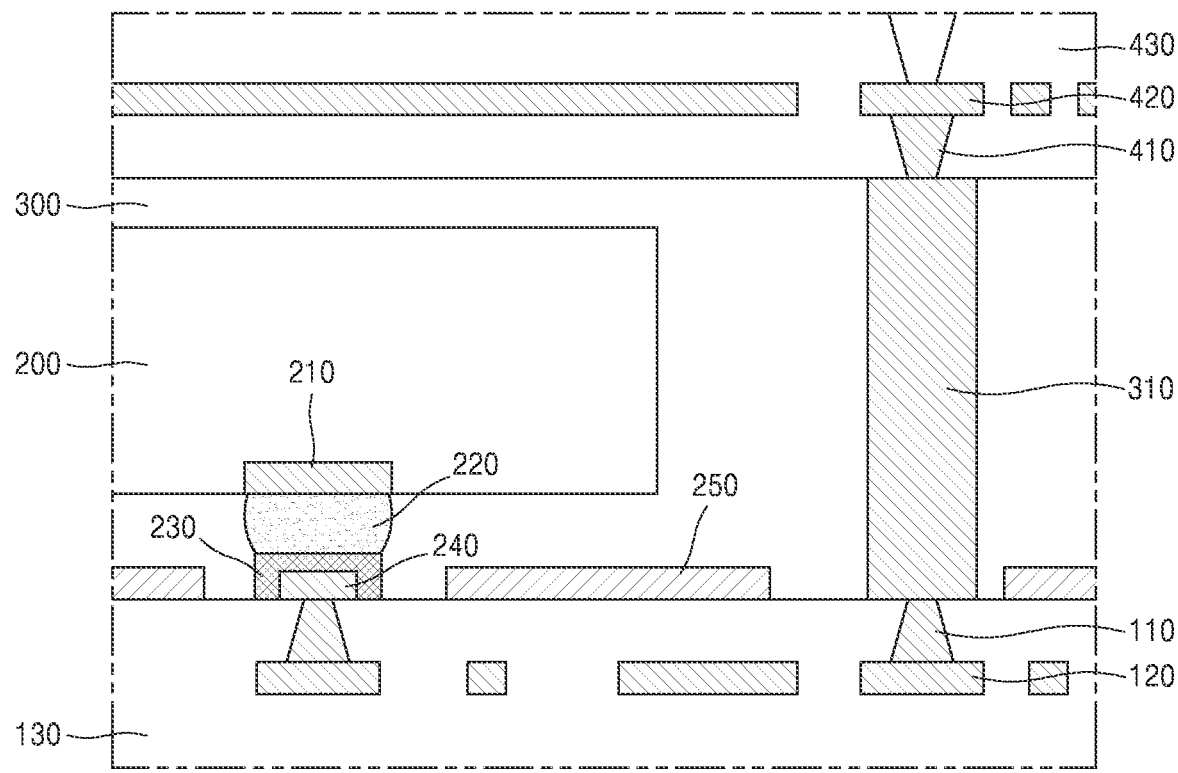

FIG. 1 is a cross-sectional view of a semiconductor package 1000 according to an example embodiment. FIGS. 2A and 2B are enlarged cross-sectional views of a portion corresponding to portion POR in FIG. 1.

Referring to FIGS. 1 and 2A, the semiconductor package 1000 may include the first redistribution structure 100, a semiconductor chip 200, a wetting layer 250, a molding layer 300, a through electrode 310.

Unless particularly defined below, a direction vertical to an upper surface of a first redistribution structure 100 may be defined as a vertical direction, and a direction in parallel with the upper surface of the first redistribution structure 100 may be defined as a horizontal direction.

In addition, a vertical direction length may be defined as a vertical depth, and a horizontal direction length may be defined as a horizontal direction width.

The first redistribution structure 100 may include a first redistribution via 110, a first redistribution layer 120, and a first dielectric layer 130. The first redistribution via 110 may extend in the vertical direction. In an embodiment, a horizontal width of the first redistribution via 110 may increase from an upper surface of the first redistribution via 110 toward a lower surface thereof. In other words, the first redistribution via 110 may have a structure tapered in a direction from the upper surface thereof toward the lower surface thereof, as illustrated in FIG. 1. The first redistribution via 110 may penetrate the first dielectric layer 130 in the vertical direction. The first redistribution layer 120 may extend in the horizontal direction. The first redistribution layer 120 may contact and be electrically connected to the first redistribution via 110. The first redistribution via 110 and the first redistribution layer 120 may include, for example, a metal, such as copper (Cu), aluminum (Al), silver (Ag), gold (Au), tungsten (W), cobalt (Co), tin (Sn), nickel (Ni), and titanium (Ti), or an alloy thereof, but are not limited thereto. The first dielectric layer 130 may surround side surfaces of the first redistribution via 110 and the first redistribution layer 120, as illustrated in FIG. 1. The first dielectric layer 130 may include a photo imageable dielectric (PID). For example, the first dielectric layer 130 may include photosensitive polyimide (PSPI). In an embodiment, the first redistribution structure 100 may have a structure, in which a plurality of layers are stacked. For example, the first redistribution structure 100 may include a plurality of first redistribution layers 120 and a plurality of dielectric layers 130, and the first redistribution layers 120 at different vertical levels may be electrically connected to the first redistribution vias 110.

The semiconductor chip 200 may be arranged on the first redistribution structure 100. For example, the semiconductor chip 200 may be mounted on the first redistribution structure 100 in a flip chip method.

The semiconductor chip 200 may include a memory chip or a logic chip. The memory chip may include, for example, a volatile memory semiconductor chip, such as dynamic random access memory (RAM) (DRAM) and static RAM (SRAM), or a nonvolatile memory chip, such as phase-change RAM (PRAM), magneto-resistive RAM (MRAM), ferroelectric RAM (FeRAM), and resistive RAM (RRAM). The logic chip may include, for example, a microprocessor, an analog element, or a digital signal processor.

The semiconductor chip 200 may include a semiconductor substrate and chip pads 210 arranged in one surface of the semiconductor substrate. The semiconductor substrate may include a Group IV semiconductor, such as silicon (Si) and germanium (Ge), a Group IV-IV compound semiconductor, such as silicon-germanium (SiGe) and silicon carbide (SiC), or a Group III-V semiconductor, such as gallium arsenide (GaAs), indium arsenide (InAs), and indium phosphide (InP). The semiconductor substrate may include a conductive region, for example, a well doped with impurities. The semiconductor substrate may have various element isolation structures, such as a shallow trench isolation (STI) structure.

The semiconductor substrate may include an active surface and an inactive surface opposite to the active surface. In an embodiment, the active surface of the semiconductor substrate may face the first redistribution structure 100. A semiconductor device including a plurality of individual devices of various types may be formed on the active surface of the semiconductor substrate. For example, the plurality of individual devices may include various microelectronic device, for example, a metal-oxide-semiconductor field effect transistor (MOSFET), such as a complementary metal-oxide-semiconductor (CMOS) transistor, an image sensor, such as a system large scale integration (LSI) and a CMOS imaging sensor (CIS), a micro electro-mechanical system (MEMS), an active device, a passive device, etc.

In an embodiment, the semiconductor package 1000 may also include two or more semiconductor chips 200. In this case, the semiconductor chips 200 may include semiconductor chips of the same type. For example, two semiconductor chips 200 may be mounted in the semiconductor package 1000, and both of the semiconductor chips 200 may include memory chips.

The chip pads 210 may be arranged in a lower surface of the semiconductor chip 200. The chip pads 210 may include a conductive material, for example, a metal, such as Cu, Al, Ag, Ti, and Ni, or an alloy thereof, but are not limited thereto.

A connection bump 220 may be arranged on a lower surface of each of the chip pads 210. In this case, the lower surface of the chip pad 210 may contact an upper surface of the connection bump 220, and the chip pads 210 may be electrically and respectively connected to the connection bump 220. The connection bump 220 may include, for example, Sn, Pb, Ag, Cu, or an alloy thereof, but is not limited thereto.

A connection pad 240 may be arranged on the first redistribution structure 100. A lower surface of the connection pad 240 may contact the upper surface corresponding thereto of the first redistribution via 110. The connection pad 240 may be electrically connected to the first redistribution structure 100 via the first redistribution via 110 corresponding thereto. In some embodiment, the connection pad 240 may include the same material as the through electrode 310. For example, the connection pad 240 and the through electrode 310 may include Cu, but are not limited thereto.

In an embodiment, a metal layer 230 may be arranged between the connection bump 220 and the connection pad 240, which correspond to each other. The metal layer 230 may cover a lower surface of the connection bump 220. The metal layer 230 may cover an upper surface of the connection pad 240, and surround side surfaces of the connection pad 240, as illustrated in FIG. 1. In this case, the metal layer 230 may be electrically connected to the connection bump 220 and the connection pad 240.

In an embodiment, the metal layer 230 may include any one of Ni, Au, and an alloy thereof, but is not limited thereto. In some embodiment, the metal layer 230 may have a stacked structure. For example, the metal layer 230 may have a structure, in which an Ni layer and an Au layer are sequentially stacked.

Because the metal layer 230 is arranged between the connection pad 240 and the connection bump 220, and covers the upper surface of the connection pad 240 and surrounds the side surfaces of the connection pad 240, an issue of poor wettability of the connection bump 220 may be improved, and the connection bump 220 and the connection pad 240 may be better connected to each other. Accordingly, the electrical connection reliability of the semiconductor package 1000 may be improved.

The molding layer 300 may be arranged on the upper surface of the first redistribution structure 100. The molding layer 300 may surround at least a portion of the semiconductor chip 200. For example, the molding layer 300 may surround an upper surface, side surfaces, and at least portions of a lower surface of the semiconductor chip 200, as illustrated in FIG. 1. The molding layer 300 may include, for example, epoxy molding compound (EMC). However, the embodiment is not limited thereto, and the molding layer 300 may also include, for example, an epoxy-based material, a thermosetting material, a thermoplastic material, a UV-treated material, etc.

The through electrode 310 may penetrate at least a portion of the molding layer 300 and extend in the vertical direction. The through electrode 310 may be spaced apart from the side surface of the semiconductor chip 200 in the horizontal direction. In an embodiment, the semiconductor chip 200 may be arranged on a central portion of the first redistribution structure 100, and the through electrode 310 may be spaced apart from the semiconductor chip 200 in the horizontal direction and arranged on periphery portions of the first redistribution structure 100, as illustrated in FIG. 1. The through electrode 310 may have, for example, a post shape or a pillar shape extending in the vertical direction. The through electrode 310 may include, for example, Cu, but is not limited thereto. In an embodiment, the through electrode 310 may extend from an upper surface of the molding layer 300 to a lower surface of the molding layer 300 in the vertical direction, and a lower surface of the through electrode 310 may contact the upper surface of the first redistribution via 110 corresponding thereto, as illustrated in FIG. 1. An upper surface of the through electrode 310 and the upper surface of the molding layer 300 may be coplanar with each other. In other words, the through electrode 310 may directly contact the first redistribution via 110 and be connected to the first redistribution structure 100 without using a discrete through electrode pad. In general, a horizontal width of a through electrode pad may be greater than that of a through electrode. The through electrode 310 included in the semiconductor package 1000 may be directly connected to the first redistribution via 110 without using a through electrode pad, and thus, an I/O terminal density in a fan-out region of the semiconductor package 1000 may increase. Accordingly, the performance of the semiconductor package 1000 may be improved.

The wetting layer 250 may be arranged between the first redistribution structure 100 and the molding layer 300. A lower surface of the wetting layer 250 may contact the upper surface of the first redistribution structure 100. The wetting layer 250 may have a conformal shape (i.e., the wetting layer 250 may conform to various configurations of the upper surface of the first redistribution structure 100). An upper surface of the wetting layer 250 may contact the molding layer 300. In an embodiment, referring to FIG. 2A, the upper surface of the wetting layer 250 may be at a lower vertical level than the upper surface of the connection pad 240, and at a higher vertical level than the lower surface of the connection pad 240. In another embodiment, referring to FIG. 2B, the upper surface of the wetting layer 250 may be substantially at the same vertical level as the upper surface of the connection pad 240. In some embodiments, the upper surface of the wetting layer 250 may be at a higher vertical level than the upper surface of the connection pad 240, and at a lower vertical level than the lower surface of the semiconductor chip 200. The lower surface of the wetting layer 250, the lower surface of the molding layer 300, and the lower surface of the through electrode 310 may be coplanar with each other.

In an embodiment, the wetting layer 250 may include openings penetrating the wetting layer 250 in the vertical direction. The openings of the wetting layer 250 may be at the central portion of the wetting layer 250, and on a periphery of the wetting layer 250 surrounding the central portion of the wetting layer 250. The connection pads 240 may be arranged respectively in the openings of the wetting layer 250 at the central portion of the wetting layer 250, and the through electrodes 310 may be arranged in the openings of the wetting layer 250 on the periphery of the wetting layer 250, as illustrated in FIG. 1. The through electrodes 310 and the connection pads 240 may be spaced apart from inner surfaces of the corresponding openings. In an example embodiment, a separation distance between the through electrodes 310 and the inner surfaces of the openings of the wetting layer 250 may be the same as a separation distance between the connection pads 240 and the inner surfaces of the openings of the wetting layer 250. The openings of the wetting layer 250 may have, for example, a circular shape, but are not limited thereto.

In an example embodiment, when the semiconductor package 1000 includes a metal layer 230, the connection pads 240 and the metal layers 230 may be arranged in the openings at the central portion of the wetting layer 250, and the through electrodes 310 may be arranged in the openings of the wetting layer 250 on the periphery of the wetting layer 250. The through electrodes 310 and the metal layers 230 surrounding the connection pads 240 may be spaced apart from the inner surfaces of the corresponding openings. In an example embodiment, a separation distance between the through electrodes 310 and the inner surfaces of the openings may be the same as a separation distance between the metal layers 230 surrounding the connection pads 240 and the inner surfaces of the openings.

The wetting layer 250 may include, for example, any one of TaN, Ta, SiO, and SiN, but is not limited thereto.

Because the semiconductor package 1000 includes the wetting layer 250 arranged between the first redistribution structure 100 and the molding layer 300, the molding layer 300 may be better combined with the first redistribution structure 100, and while a molded underfill (MUF) process is performed, a generation rate of bubbles in the molding layer 300 filled between the first redistribution structure 100 and the semiconductor chip 200 may be lowered.

In an embodiment, the semiconductor package 1000 may further include a second redistribution structure 400. The second redistribution structure 400 may be arranged on the molding layer 300, as illustrated in FIG. 1. The second redistribution structure 400 may include a second redistribution via 410, a second redistribution layer 420, and a second dielectric layer 430. Because the second redistribution via 410, the second redistribution layer 420, the second dielectric layer 430 are respectively similar to the first redistribution via 110, the first redistribution layer 120, and the first dielectric layer 130 described above, hereinafter, differences therebetween are mainly described.

In an embodiment, a horizontal width of the second redistribution via 410 may decrease from an upper surface of the second redistribution via 410 toward a lower surface thereof, as illustrated in FIG. 1. In other words, the second redistribution via 410 may have a structure tapered in a direction from the lower surface thereof toward the upper surface thereof. In an embodiment, the second redistribution via 410 may contact the through electrode 310. In other words, the lower surface of the second redistribution via 410 may contact the upper surface of the through electrode 310. In this case, the upper surface of the through electrode 310 may contact the second redistribution via 410 and the lower surface thereof may contact the first redistribution via 110, and the through electrode 310 may be electrically connected to the first redistribution structure 100 and the second redistribution structure 400.

In an embodiment, the semiconductor package 1000 may further include an external connection terminal 500. The external connection terminal 500 may be attached on the lower surface of the first redistribution structure 100. The external connection terminal 500 may include, for example, Cu, Pb, Sn, Ag, or an alloy thereof, but is not limited thereto. The semiconductor package 1000 may be electrically connected to an external electronic device via the external connection terminal 500, and thus, may receive at least one of a control signal, a power signal, and a ground signal for an operation of the semiconductor chip 200 from the outside, or may receive a data signal stored in the semiconductor chip 200 from the outside, or may provide data stored in the semiconductor chip 200 to the outside.

Figure 3:
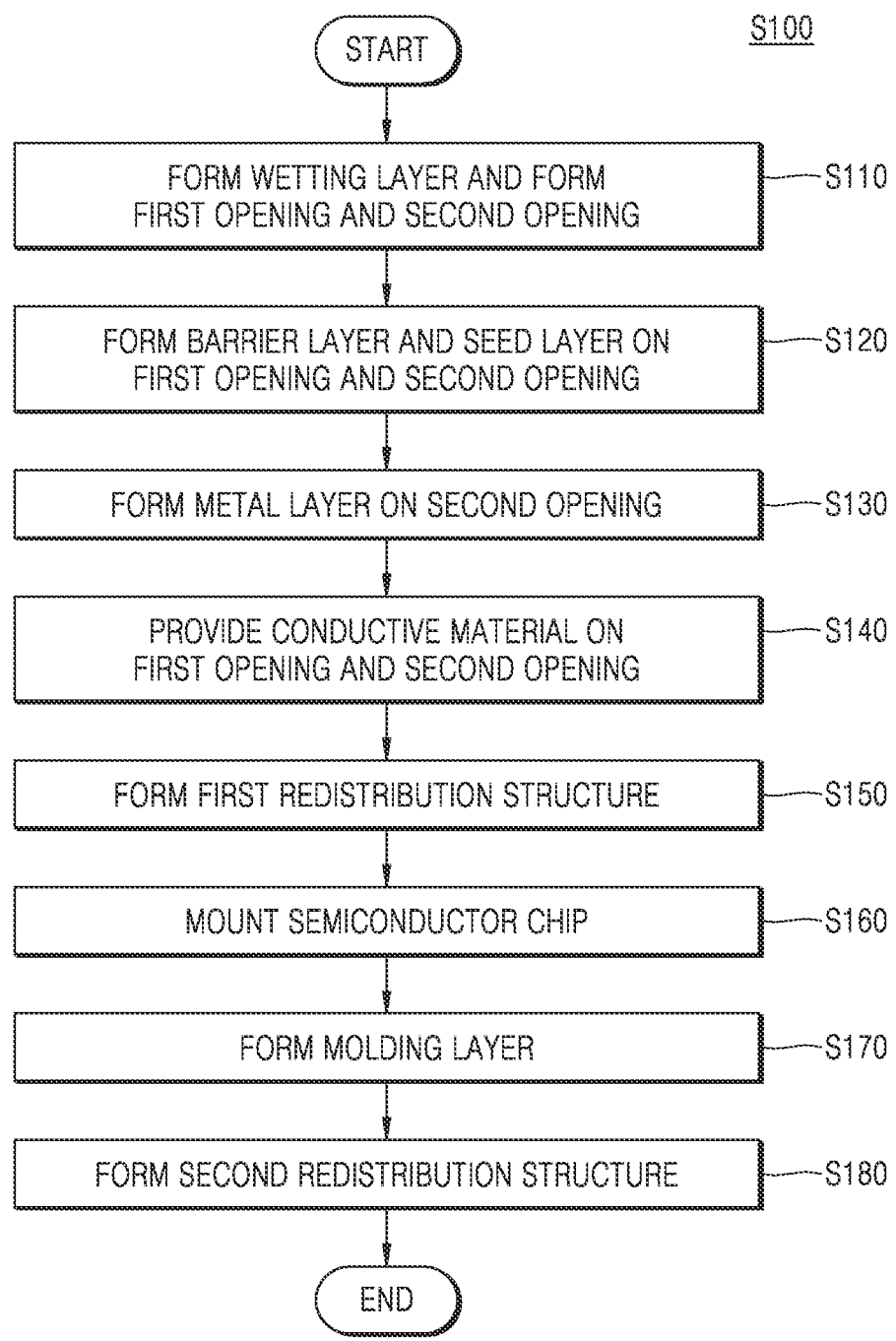
FIG. 3 is a flowchart illustrating a manufacturing process of a semiconductor package, according to an example embodiment.

FIG. 3 is a flowchart illustrating a manufacturing process of the semiconductor package 1000, according to an example embodiment. FIGS. 4A through 4H are cross-sectional views illustrating each operation of a manufacturing process of the semiconductor package 1000, according to example embodiments.

Referring to FIGS. 3 and 4, the wetting layer 250 may be formed on a carrier substrate SC, and a first opening O1 and a second opening O2 may be formed in the carrier substrate SC (S110). In this case, the first opening O1 may have a first vertical depth d1, may be referred to as an opening formed in a periphery of the carrier substrate SC, the second opening O2 may have a second vertical depth d2, and may be referred to as an opening formed in the central portion of the carrier substrate SC. The first opening O1 and the second opening O2 may penetrate the wetting layer 250, and extend into the carrier substrate SC. Firstly, the wetting layer 250 may be formed on one surface of the carrier substrate SC (S110). The wetting layer 250 may be deposited by using, for example, physical vapor deposition (PVD), chemical vapor deposition (CVD), or atomic layer deposition (ALD), but is not limited thereto. The wetting layer 250 may conformally cover one surface of the carrier substrate SC. Next, the first opening O1 and the second opening O2 may be formed in one surface of the carrier substrate SC. The first opening O1 and the second opening O2 may be formed by using, for example, reactive ion etching (RIE), but are not limited thereto. In an embodiment, the first and second vertical depths d1 and d2 of the first opening O1 and the second opening O2 may be different from each other, respectively. For example, the first vertical depth d1 of the first opening O1 may be greater than the second vertical depth d2 of the second opening O2. In a process of forming the first opening O1 and the second opening O2, the wetting layer 250 may be used as an etching mask. The carrier substrate SC may include, for example, silicon, but is not limited thereto.

Figure 4B:
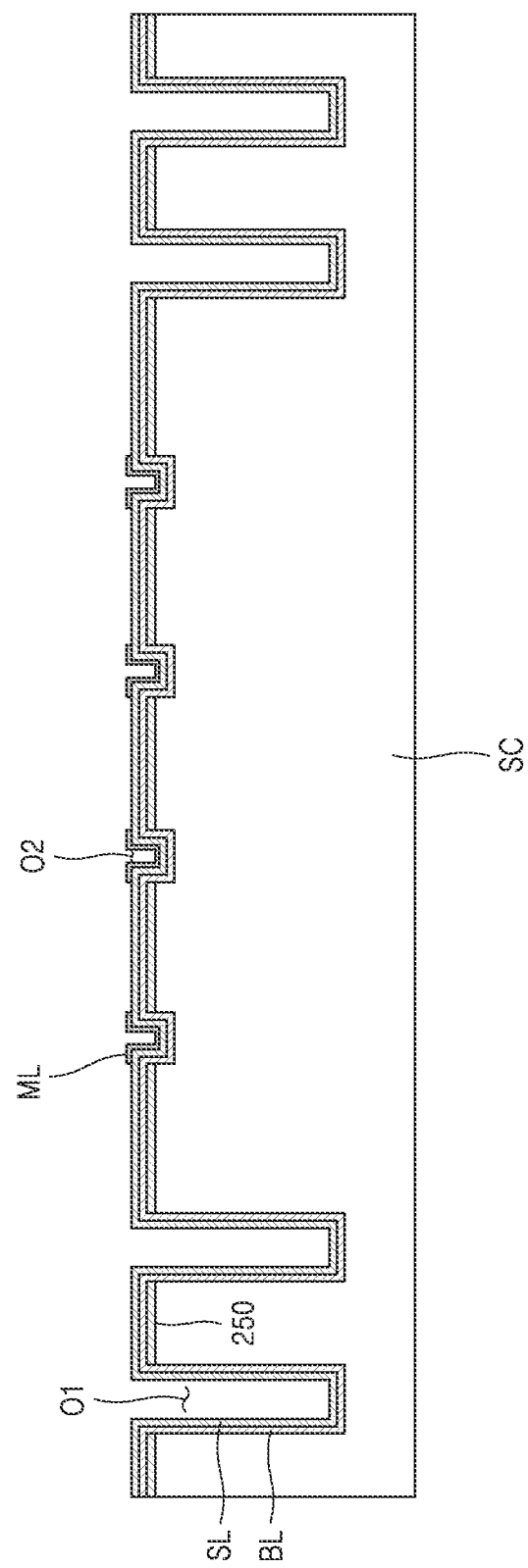

Referring to FIGS. 3 and 4B, a barrier layer BL and a seed layer SL may be formed on the upper surface of the wetting layer 250 on one surface of the carrier substrate SC, and internal surfaces and lower surfaces of the first opening O1 and the second opening O2 (S120), and a metal layer ML may be formed on a portion of the seed layer SL inside the second opening O2 and on a portion of the seed layer SL adjacent to the second opening O2 (S130). Firstly, in operation S120, the barrier layer BL and the seed layer SL may be sequentially formed. The barrier layer BL and the seed layer SL may be deposited by using, for example, PVD, CVD, or ALD, but are not limited thereto. The barrier layer BL and the seed layer SL may conformally cover the internal surfaces and the lower surfaces of the first opening O1 and the second opening O2. The barrier layer BL may include any one of, for example, Ta, Ti, W, Ru, V, Co, and Nb, but is not limited thereto. The seed layer SL may include any one of, for example, Al, Ti, Cr, Fe, Co, Ni, Cu, Zn, Pd, Pt, Au, and Ag, but is not limited thereto. The metal layer ML may be formed on a portion of the seed layer SL inside the second opening O2, and on a portion of the seed layer SL adjacent to the second opening O2 (S130). The metal layer ML may not fill all of the second opening O2. The metal layer ML may be formed by using the same method as the method of forming the barrier layer BL and the seed layer SL. The metal layer ML may conformally cover a portion of the seed layer SL inside the second opening O2 and a portion of the seed layer SL adjacent to the second opening O2. The metal layer ML may include, for example, Ni, Au, or an alloy thereof, but is not limited thereto. In an embodiment, the metal layer ML may have a stacked structure. In this case, layers constituting the metal layer ML may be sequentially formed by using the same method as the method of forming the barrier layer BL and the seed layer SL. When the metal layer ML has a stacked structure, the stacked structure may include a stacked structure, in which an Ni layer and an Au layer are sequentially stacked.

Figure 4C:
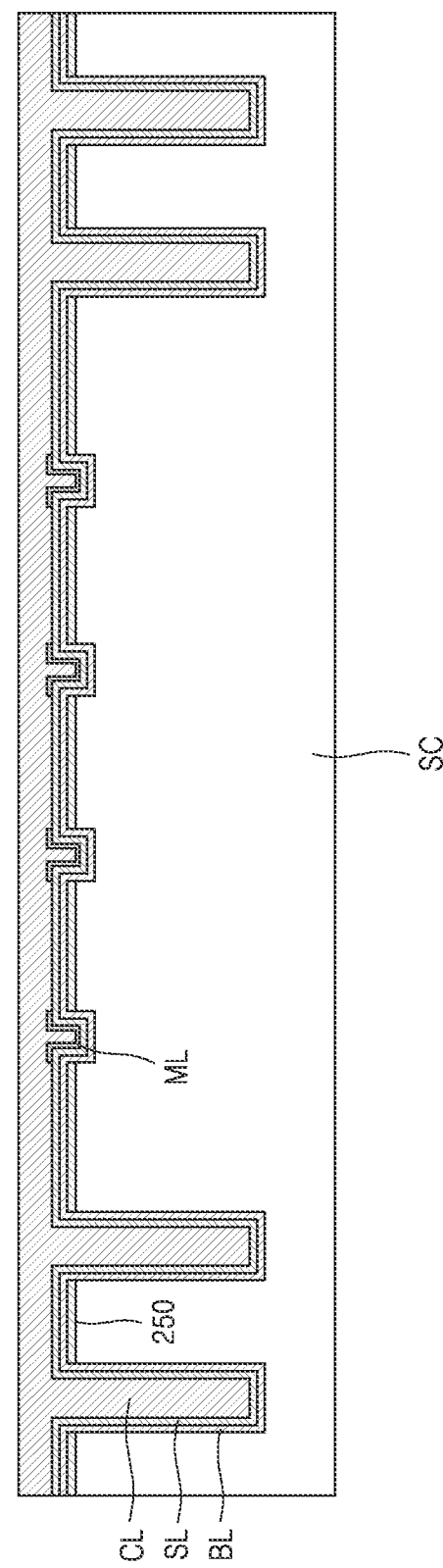
Figure 4D:
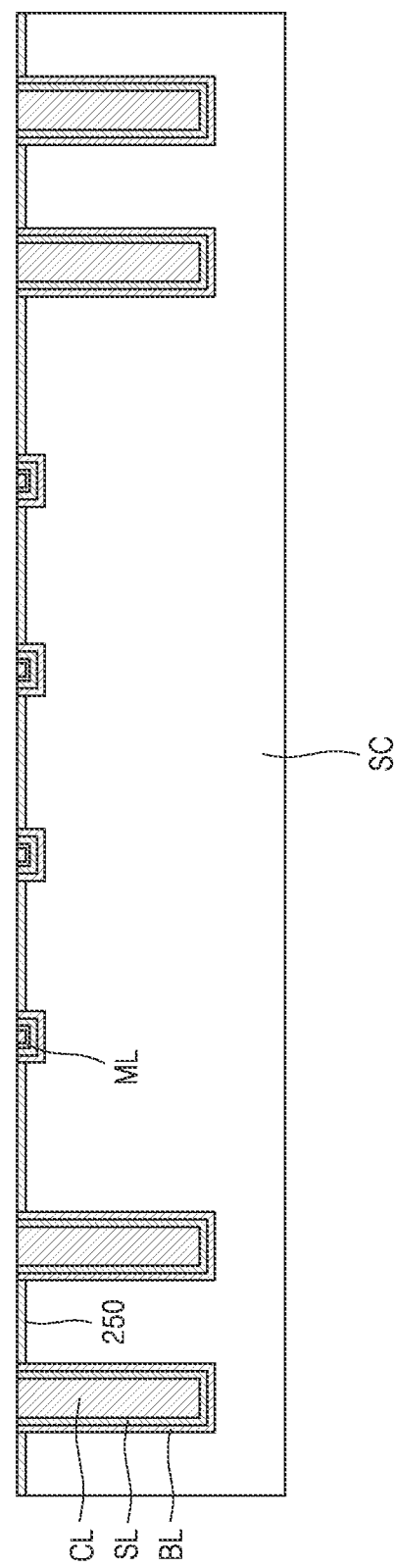

Referring to FIGS. 3, 4C, and 4D, a conductive material CL may be formed on the seed layer SL and the metal layer ML (S140). The conductive material CL may include, for example, Cu, but is not limited thereto. The conductive material CL may be provided by using, for example, a plating process, such as an electrochemical plating process. The conductive material CL may fill the first opening O1 and the second opening O2. After operation S140, at least portions of the conductive material CL, the metal layer ML, the seed layer SL, and the barrier layer BL may be removed by using a planarization process. For example, by using a planarization process, an upper surface of the conductive material CL, an upper surface of the metal layer ML, an upper surface of the seed layer SL, and an upper surface of the barrier layer BL may be at the same vertical level as (i.e., coplanar with) the upper surface of the wetting layer 250 formed on the carrier substrate SC. A planarization process may include, for example, a chemical mechanical polishing (CMP) process.

Figure 4E:
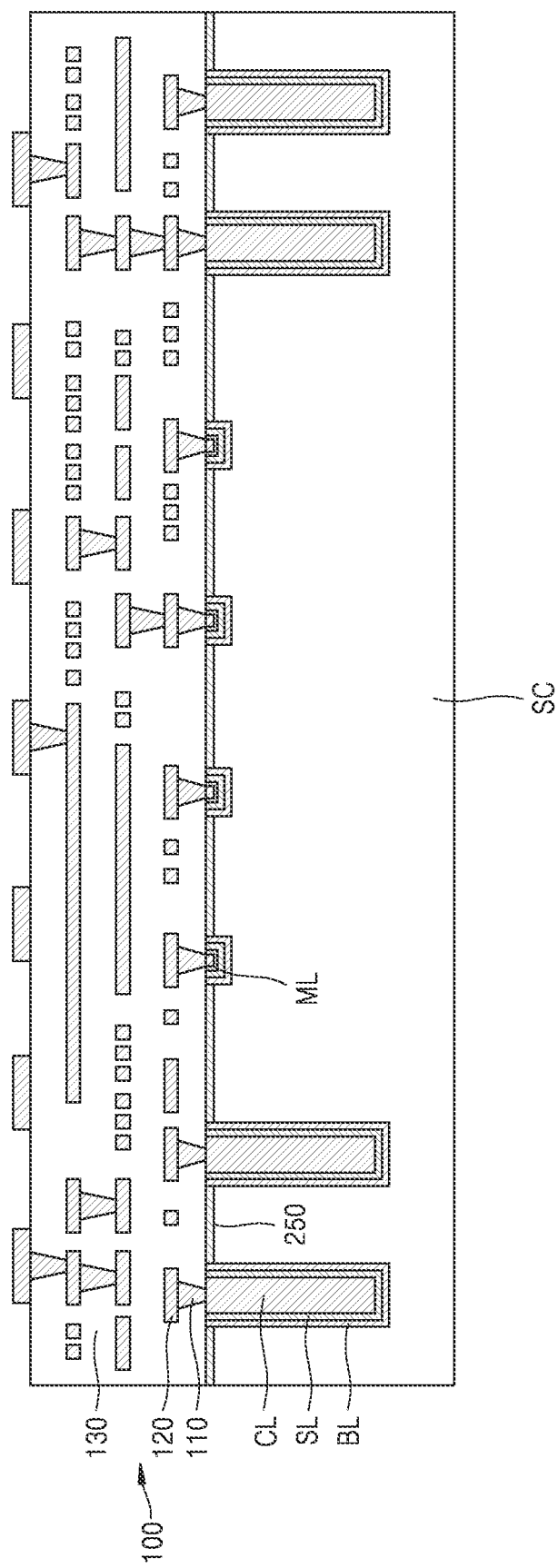
Figure 4F:
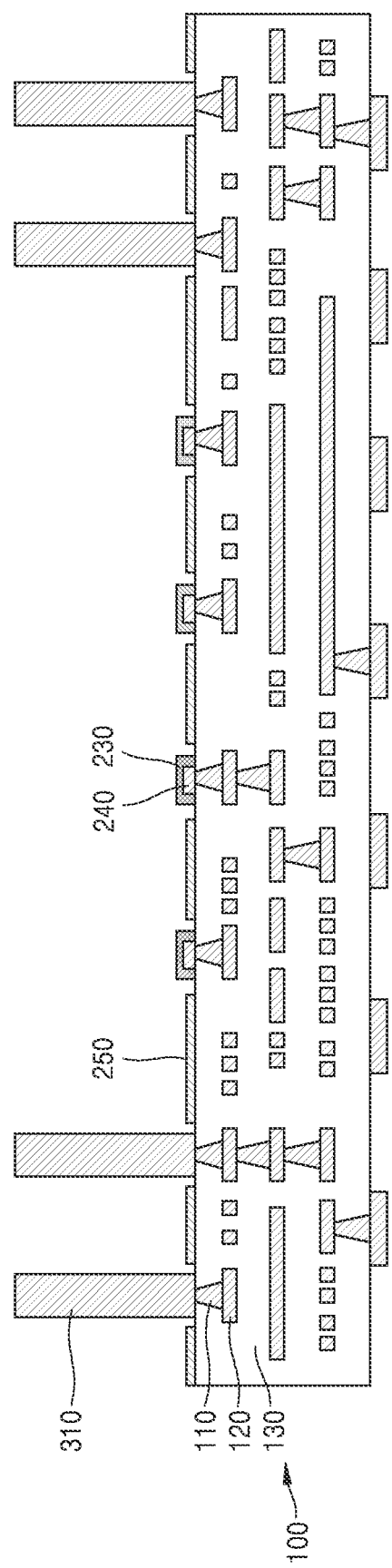

Referring to FIGS. 3, 4E, and 4F, the first redistribution structure 100 may be formed on the carrier substrate SC (S150). After the first dielectric layer 130 is formed, the first redistribution structure 100 may be formed by repeatedly performing a forming process of the first dielectric layer 130 and a forming process of the first redistribution via 110 and the first redistribution layer 120. In this case, the first redistribution via 110 may be directly connected to the conductive material CL filling the first opening (O1 in FIG. 4B) and the second opening (O2 in FIG. 4B). After the first redistribution structure 100 is formed, the carrier substrate SC and the first redistribution structure 100 may be overturned. Next, the carrier substrate SC, a remaining barrier layer BL, and a remaining seed layer SL may be sequentially removed. Accordingly, portions of the wetting layer 250, the conductive material CL filling the first opening O1, the metal layer ML formed in the second opening O2, and the upper surface of the first redistribution structure 100 may be exposed. The conductive material CL filling the first opening O1 may become the through electrode 310, the conductive material CL filling the second opening O2 may become the connection pad 240, and the metal layer ML formed in the second opening O2 may become the metal layer 230. Because the wetting layer 250 contacts the barrier layer BL and the seed layer SL surrounding the through electrode 310 and the metal layer 230, the barrier layer BL and the seed layer SL surrounding the through electrode 310 and the metal layer 230 may be removed, and then, the wetting layer 250 may be apart from the through electrode 310 and the metal layer 230. In the case of the semiconductor package 1000 according to embodiments of the inventive concept, unlike a general chip-last method, the through electrode 310 may be formed in advance, and then, the first redistribution structure 100 may be formed. Accordingly, a discrete through electrode pad may not be arranged between the first redistribution structure 100 and the through electrode 310, and the first redistribution via 110 of the first redistribution structure 100 and the through electrode 310 may be directly connected to each other.

Figure 4G:
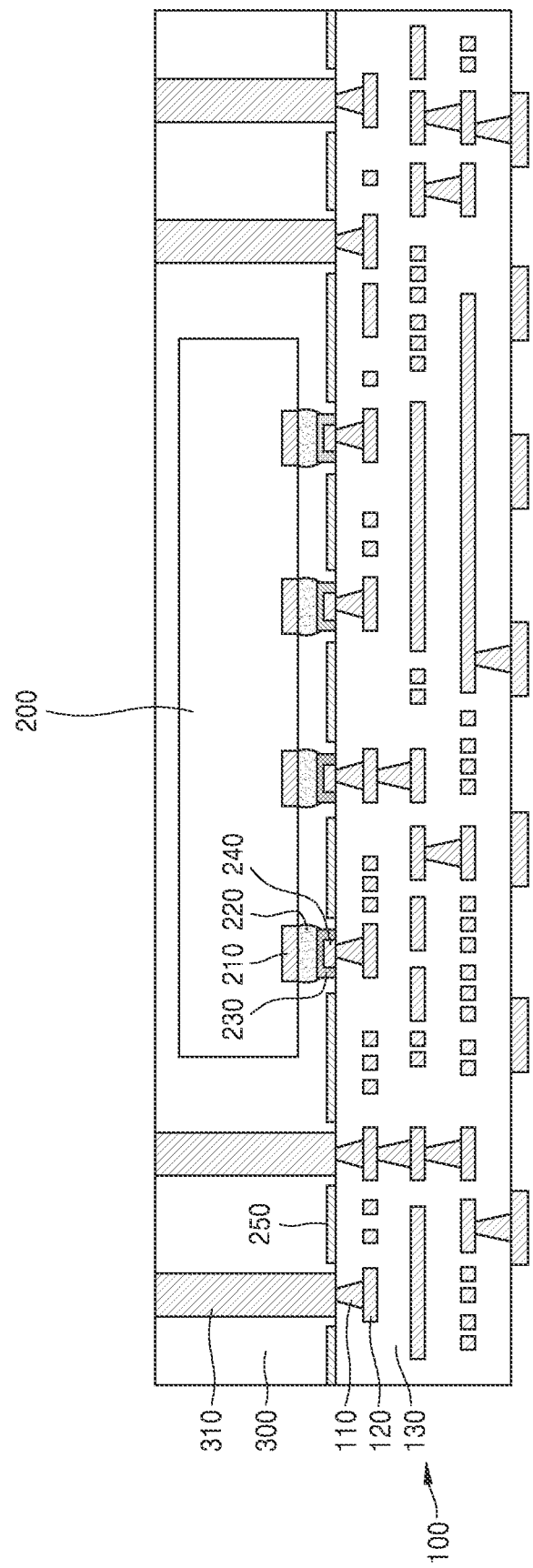

Referring to FIGS. 3 and 4G, the semiconductor chip 200 may be mounted on the first redistribution structure 100 (S160). Firstly, the semiconductor chip 200 may be electrically connected to the first redistribution structure 100 via the connection bump 220. Next, the molding layer 300 may be formed (S170). The molding layer 300 may cover the upper surface of the first redistribution structure 100, and surround the semiconductor chip 200 and the through electrode 310. Because there is the wetting layer 250 arranged on the first redistribution structure 100, the molding layer 300 and the first redistribution structure 100 may be better combined with each other. In addition, a generation rate of bubbles in the molding layer 300 filled between the first redistribution structure 100 and the semiconductor chip 200 may be lowered. Next, a grinding process for adjusting a vertical depth of the molding layer 300 may be formed. By using a grinding process, the upper surface of the molding layer 300 may be at the same vertical level as (i.e., coplanar with) the upper surface of the through electrode 310. A grinding process may include, for example, a CMP process.

Figure 4H:
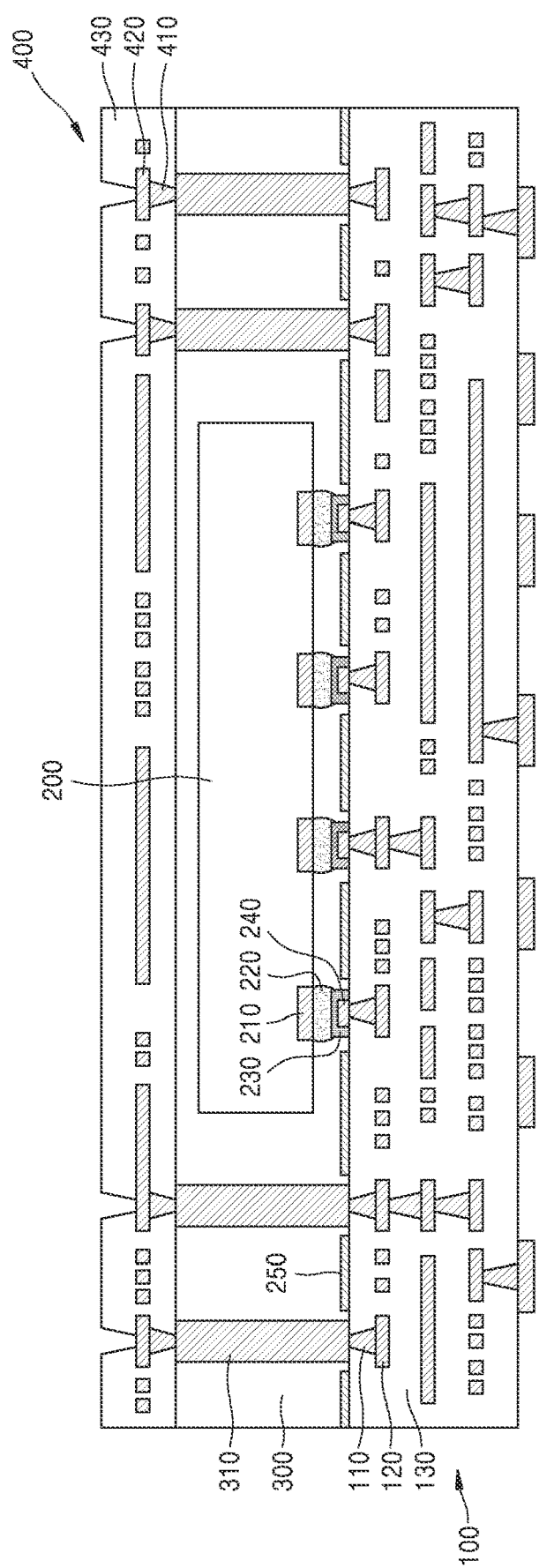

Referring to FIGS. 3 and 4H, the second redistribution structure 400 may be formed on the molding layer 300 (S180). The second redistribution structure 400 may be formed in the same method as the method of forming the first redistribution structure 100 described with reference to FIGS. 3 and 4E. Unlike as illustrated in FIG. 4H, the second redistribution structure 400 may also include a plurality of layers. Because, in a manufacturing process of the semiconductor package 1000, after the first redistribution structure 100 is formed, the carrier substrate SC and the first redistribution structure 100 are overturned, and then, the second redistribution structure 400 is formed, the first redistribution via 110 of the first redistribution structure 100 and the second redistribution via 410 of the second redistribution structure 400 may have tapered structures in opposite directions to each other, as illustrated in FIG. 4H.

Next, as illustrated in FIG. 1, the external connection terminal 500 may be attached to the lower surface of the first redistribution structure 100. The semiconductor package 1000 may be electrically connected to an external electronic device via the external connection terminal 500.

Figure 5:
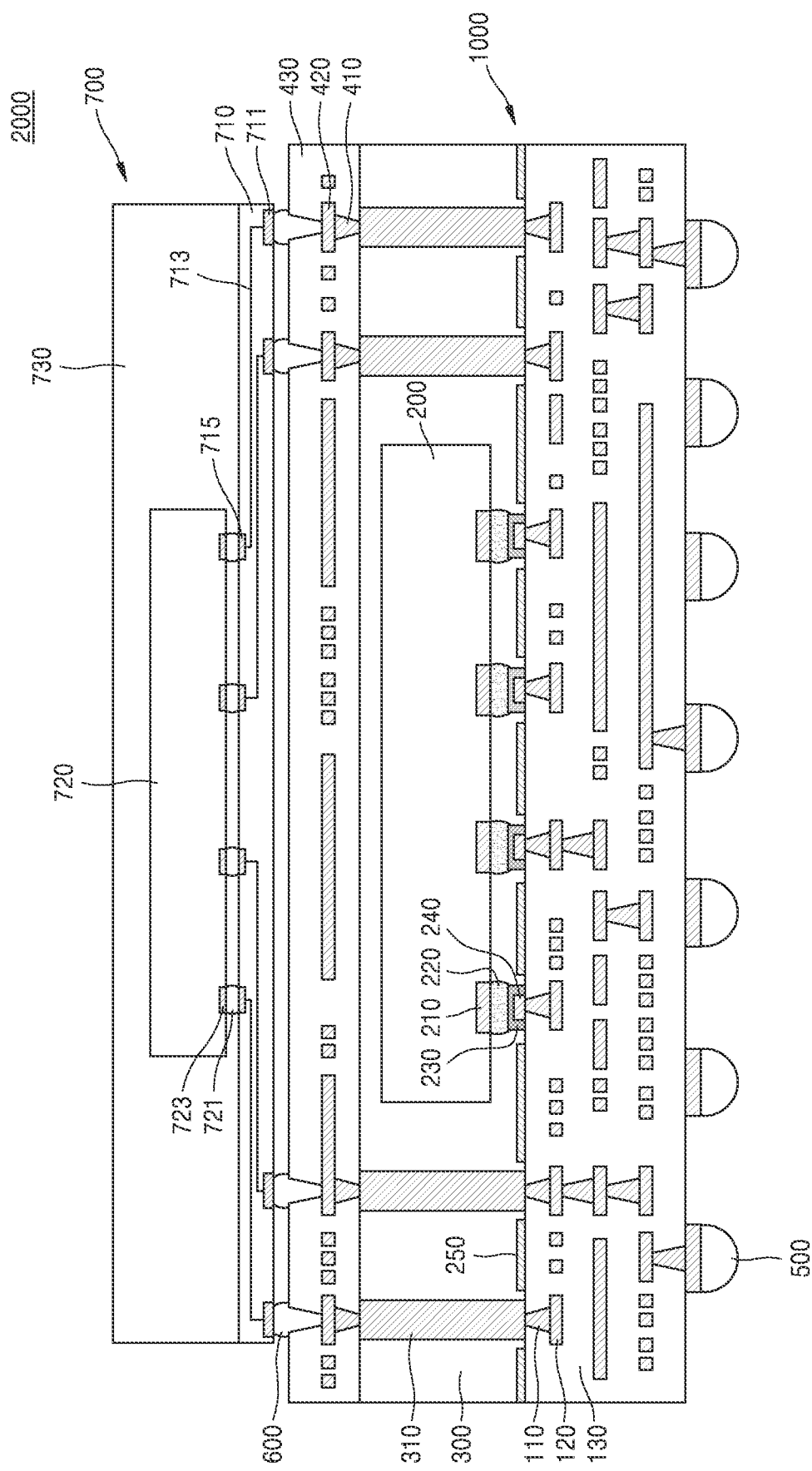
FIG. 5 is a cross-sectional view of a semiconductor package according to an example embodiment.

Referring to FIG. 5, the semiconductor package 2000 may include a first sub-semiconductor package 1000a and a second sub-semiconductor package 700. The semiconductor package 2000 may include a semiconductor package of a package-on-package (POP) type, in which the second sub-semiconductor package 700 is stacked on the first sub-semiconductor package 1000a. In this case, the first sub-semiconductor package 1000a may include the semiconductor package 1000 described with reference to FIGS. 1, 2A, and 2B. Hereinafter, differences are mainly described.

The second sub-semiconductor package 700 may include a package substrate 710, a semiconductor chip 720, and a molding layer 730.

The package substrate 710 may include, for example, a printed circuit board. The package substrate 710 may include a substrate base including phenol resin, epoxy resin, polyimide, or the like, upper pads 715 arranged on an upper surface of the substrate base, and lower pads 711 arranged on a lower surface of the substrate base. Distributions 713 configured to be electrically connected to the upper pads 715 and the lower pads 711 may be formed inside the substrate base.

The package substrate 710 may be mounted on the second redistribution structure 400 of the first sub-semiconductor package 1000a. The package substrate 710 may be connected to the second redistribution structure 400 via connection terminals 600 arranged on the second redistribution structure 400. Each of the connection terminals 600 may be connected to the second redistribution layer 420 and the lower pads 711, and may electrically connect the second redistribution structure 400 to the package substrate 710.

The semiconductor chip 720 may be arranged on the package substrate 710. For example, chip pads 723 of the semiconductor chip 720 may be electrically connected to the upper pads 715 of the package substrate 710 corresponding thereto via connection terminals 721, such as a solder and a bump.

In an embodiment, the semiconductor chip 200 and the semiconductor chip 720 may include semiconductor chips of different types from each other. For example, when the semiconductor chip 200 includes a logic chip, the semiconductor chip 720 may include a memory chip. In an embodiment, the semiconductor chip 200 and the semiconductor chip 720 may include semiconductor chips of the same type.

The molding layer 730 may be arranged on the package substrate 710 to surround at least a portion of the semiconductor chip 720. The molding layer 730 may include, for example, an EMC material. However, the molding layer 730 is not limited thereto, and may include, for example, epoxy-based molding resin, polyimide-based molding resin, etc.

While the inventive concept has been particularly shown and described with reference to embodiments thereof, it will be understood that various changes in form and details may be made therein without departing from the scope of the following claims.

What is claimed is:

1. A semiconductor package comprising:
   a first redistribution structure comprising a plurality of first redistribution layers and a plurality of first redistribution vias;
   a semiconductor chip on the first redistribution structure, the semiconductor chip comprising a chip pad;
   a connection pad between the first redistribution structure and the semiconductor chip, the connection pad connected to the first redistribution structure;
   a connection bump connected to the connection pad and the chip pad;
   a molding layer extending around the first redistribution structure and the semiconductor chip;
   a through electrode extending through the molding layer; and a wetting layer between the first redistribution structure and the molding layer, wherein the wetting layer defines a first opening and a second opening, wherein the through electrode is arranged in the first opening and the connection pad is arranged in the second opening.

2. The semiconductor package of claim 1, wherein an upper surface of the wetting layer is not coplanar with an upper surface of the connection pad, and wherein a lower surface of the wetting layer is coplanar with a lower surface of the connection pad.

3. The semiconductor package of claim 1, wherein an upper surface of the wetting layer is coplanar with an upper surface of the connection pad.

4. The semiconductor package of claim 1, wherein the wetting layer is spaced apart from the through electrode and the connection pad.

5. The semiconductor package of claim 1, wherein the wetting layer comprises any one of TaN, Ta, SiO, and SiN.

6. The semiconductor package of claim 1, further comprising a metal layer between the connection bump and the connection pad, wherein the metal layer is on an upper surface and side surfaces of the connection pad.

7. The semiconductor package of claim 6, wherein the wetting layer is spaced apart from the metal layer.

8. The semiconductor package of claim 6, wherein the metal layer comprises any one of Ni, Au, and an alloy thereof.

9. The semiconductor package of claim 1, wherein the connection pad and the through electrode comprise a same material.

10. The semiconductor package of claim 1, wherein the through electrode extends from an upper surface of the molding layer to a lower surface of the molding layer, and wherein a lower surface of the through electrode contacts an upper surface of the first redistribution via.

11. A semiconductor package comprising:
a first redistribution structure comprising a plurality of first redistribution layers and a plurality of first redistribution vias;
a semiconductor chip on the first redistribution structure, the semiconductor chip comprising a chip pad;
a connection pad between the first redistribution structure and the semiconductor chip, the connection pad connected to the first redistribution structure;
a connection bump connected to the connection pad and the chip pad;
a molding layer extending around the first redistribution structure and the semiconductor chip;
a through electrode extending through the molding layer;
a wetting layer between the first redistribution structure and the molding layer; and
a second redistribution structure on the molding layer, the second redistribution structure comprising second redistribution layers and second redistribution vias,
wherein a width of each first redistribution via increases from an upper surface of the first redistribution via toward a lower surface of the first redistribution via, and wherein a width of each second redistribution via decreases from an upper surface of the second redistribution via toward a lower surface of the second redistribution via.

12. The semiconductor package of claim 11, further comprising a metal layer between the connection bump and the connection pad, wherein the metal layer is on an upper surface and side surfaces of the connection pad.

13. The semiconductor package of claim 11, wherein an upper surface of the wetting layer is not coplanar with an upper surface of the connection pad, and wherein a lower surface of the wetting layer is coplanar with a lower surface of the through electrode.

14. The semiconductor package of claim 11, wherein the wetting layer is spaced apart from the through electrode and the connection pad, and wherein a separation distance between the wetting layer and the through electrode is identical to a separation distance between the wetting layer and the connection pad.

15. The semiconductor package of claim 11, wherein the connection pad and the through electrode comprise a same material.

16. The semiconductor package of claim 11, wherein the through electrode extends from an upper surface of the molding layer to a lower surface of the molding layer, and wherein a lower surface of the through electrode is coplanar with the upper surface of the first redistribution via.

17. A semiconductor package comprising:
a first redistribution structure comprising a plurality of first redistribution layers and a plurality of first redistribution vias;
a semiconductor chip on the first redistribution structure, the semiconductor chip comprising a chip pad;
a connection pad between the first redistribution structure and the semiconductor chip, the connection pad connected to the first redistribution structure;
a metal layer on an upper surface and side surfaces of the connection pad;
a connection bump connected to the metal layer and the semiconductor chip;
a molding layer extending around the first redistribution structure and the semiconductor chip;
a second redistribution structure on the molding layer, the second redistribution structure comprising second redistribution layers and second redistribution vias,
a wetting layer between the first redistribution structure and the molding layer; and
a through electrode extending through the molding layer, wherein the through electrode is connected to the first redistribution via and to the second redistribution via, and wherein the through electrode has a uniform width,
wherein a width of each first redistribution via increases from an upper surface of the first redistribution via toward a lower surface of the first redistribution via, and wherein a width of each second redistribution via decreases from an upper surface of the second redistribution via toward a lower surface of the second redistribution via.

18. The semiconductor package of claim 17, wherein an upper surface of the wetting layer is not coplanar with the upper surface of the first redistribution via.

19. The semiconductor package of claim 17, wherein the connection pad and the through electrode comprise copper (Cu).

20. The semiconductor package of claim 17, wherein the wetting layer is spaced apart from the through electrode and the metal layer, and wherein a separation distance between the wetting layer and the through electrode is identical to a separation distance between the wetting layer and the metal layer.

* * * * *